(12) United States Patent
Galler et al.

(10) Patent No.: US 10,381,543 B2
(45) Date of Patent: Aug. 13, 2019

(54) MULTI-LAYER COMPONENT HAVING AN EXTERNAL CONTACT

(71) Applicant: EPCOS AG, Munich (DE)

(72) Inventors: Martin Galler, Kalsdorf (AT); Harald Kastl, Deutschlandsberg (AT); Siegfried Fellner, St. Georgen (AT); Axel Pecina, St. Martin (AT); Marion Ottlinger, Deutschlandsberg (AT); Peter Gerletz, Graz (AT); Robert Krumphals, Deutschlandsberg (AT); Wolfgang Athenstaedt, Graz (AT); Ivan Jagust, Zagreb (HR); Zdravko Mijocevic, Kutina (HR); Zeljko Maric, Sisak (HR)

(73) Assignee: EPCOS AG, Munich (DE)

( * ) Notice: Subject to any disclaimer, the term of this patent is extended or adjusted under 35 U.S.C. 154(b) by 715 days.

(21) Appl. No.: 14/898,470

(22) PCT Filed: Jun. 13, 2014

(86) PCT No.: PCT/EP2014/062448
§ 371 (c)(1),
(2) Date: Dec. 14, 2015

(87) PCT Pub. No.: WO2014/198936
PCT Pub. Date: Dec. 18, 2014

(65) Prior Publication Data
US 2016/0141484 A1    May 19, 2016

(30) Foreign Application Priority Data

Jun. 14, 2013 (DE) .................. 10 2013 106 223

(51) Int. Cl.
*H01L 41/083* (2006.01)
*H01L 41/047* (2006.01)

(52) U.S. Cl.
CPC ...... *H01L 41/0472* (2013.01); *H01L 41/0475* (2013.01); *H01L 41/083* (2013.01)

(58) Field of Classification Search
CPC ............ H01L 41/0472; H01L 41/0475; H01L 41/083
(Continued)

(56) References Cited

U.S. PATENT DOCUMENTS 3,378,704 A * 4/1968 Smith ................. H01L 41/0833
156/224
5,208,506 A * 5/1993 Yamashita ............ H01L 41/053
310/328

(Continued)

FOREIGN PATENT DOCUMENTS

DE    19930585 A1    2/2000
DE    102005014762 A1 * 9/2006 ........... H01L 41/047
(Continued)

*Primary Examiner* — Thomas M Dougherty
(74) *Attorney, Agent, or Firm* — Morgan, Lewis & Bockius LLP

(57) ABSTRACT

A multi-layer component (1) is specified, comprising a main body (2) with an external contact (3) arranged thereon, a further contact (5) for electrically contacting the multi-layer component (1), and a connecting element (4) for connecting the external contact (3) and the further contact (5), wherein the connecting element (4) is embodied in such a way that a decoupling of mechanical stresses that occur in the further contact (5) from the external contact (3) is brought about.

9 Claims, 3 Drawing Sheets

Figure 1:
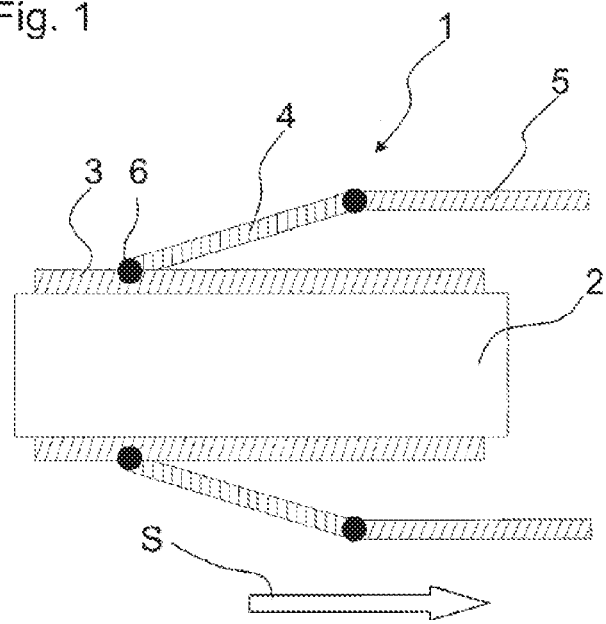

(58) Field of Classification Search
USPC .......................................................... 310/366
See application file for complete search history.

(56) References Cited

U.S. PATENT DOCUMENTS

| | | | |
|---|---|---|---|
| 6,037,702 A | 3/2000 | Tamai | |
| 9,214,620 B2* | 12/2015 | Brantweiner | ....... H01L 41/0472 |
| 2002/0135275 A1* | 9/2002 | Heinz | ................. H01L 41/0472 |
| | | | 310/366 |
| 2004/0108792 A1* | 6/2004 | Lubitz | ................. H01L 41/0475 |
| | | | 310/366 |
| 2006/0055288 A1* | 3/2006 | Heinzmann | ......... H01L 41/0472 |
| | | | 310/364 |

FOREIGN PATENT DOCUMENTS

| | | | |
|---|---|---|---|
| DE | 102005014766 A1 * | 9/2006 | ........... H01L 41/053 |
| DE | 102006001134 A1 | 7/2007 | |
| DE | 102009034099 A1 | 1/2011 | |
| DE | 102009054068 A1 | 5/2011 | |
| DE | 102010049574 A1 | 2/2012 | |
| JP | 4-138081 A * | 5/1992 | ............... H02N 2/00 |
| JP | 2003502869 A | 1/2003 | |
| JP | 2005183478 A | 7/2005 | |
| JP | 2007173320 A | 7/2007 | |
| JP | 2008098655 A | 4/2008 | |
| WO | WO-0079607 A1 | 12/2000 | |
| WO | 02/39510 A1 | 5/2002 | |
| WO | 03/005490 A2 | 1/2003 | |
| WO | 2005/124884 A1 | 12/2005 | |
| WO | 2010/020643 A1 | 2/2010 | |

* cited by examiner

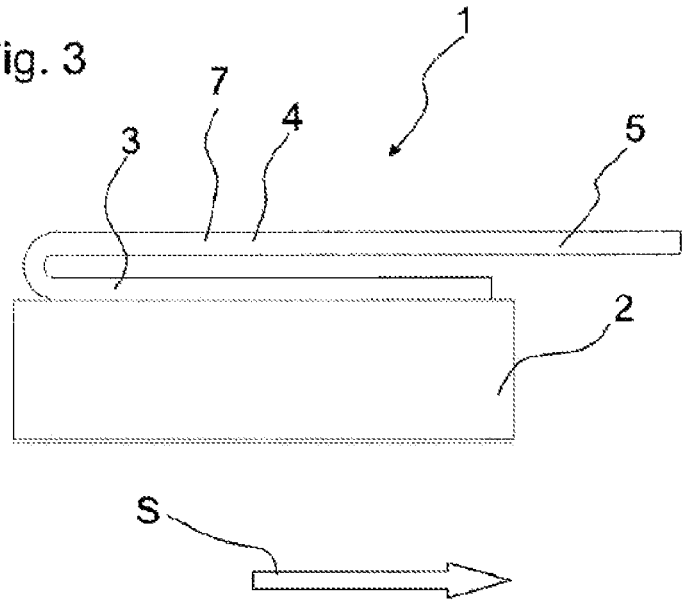
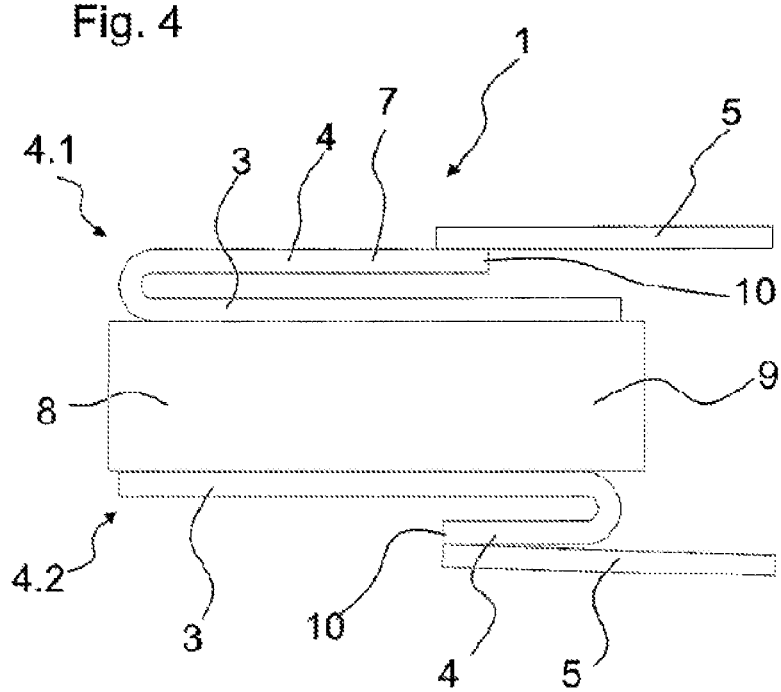

MULTI-LAYER COMPONENT HAVING AN EXTERNAL CONTACT

A multi-layer component comprising an external contact, a further contact and a connecting element is specified. By way of example, the multi-layer component is a piezo-actuator that can be used for actuating an injection valve in a motor vehicle. Alternatively, the multi-layer component can be for example a multi-layer capacitor or a multi-layer varistor.

Document DE 199 30585 A1 describes a piezo-actuator comprising a contact lug for electrically contacting an electrode. Document DE 10 2009 054 068 A1 describes external electrodes in the form of wire fabrics.

For contacting a multi-layer component, by way of example, an external contact of the multi-layer component is soldered to a further contact. In this case, however, mechanical stresses can arise between the further contact and the external contact. Said stresses can lead to damage or to failure of the multi-layer component.

One object to be achieved is that of specifying an improved multi-layer component. In particular, one object to be achieved is that of specifying a particularly reliable multi-layer component.

A multi-layer component is specified, comprising a main body with an external contact arranged thereon, a further contact for electrically contacting the multi-layer component, and a connecting element for connecting the external contact and the further contact. The connecting element is embodied in such a way that a decoupling of mechanical stresses that occur in the further contact from the external contact is brought about. This means, in particular, that mechanical stresses that occur in the further contact are decoupled from the external contact, and vice versa.

Preferably, the connecting element is embodied in such a way that it only produces the electrical contact between external contact and further contact and produces no appreciable mechanical coupling between the external contact and the further contact.

The advantage of a multi-layer component having a decoupling of mechanical stresses between the further contact and the external contact is that it is possible to relieve the loading on the external contact at the main body in relation to loads from the further contact. Damage to the external contact can be prevented as a result. The loading on the connection between the further contact and the external contact is also relieved. By way of example, it is possible to prevent tensile loads from being able to act on the external contact via the further contact. In particular, the further contact subjected to a mechanical load is prevented from transmitting the latter to the external contact. In addition, it is possible to compensate for relative movements between the external contact and the further contact.

The main body of the multi-layer component can comprise a stack of dielectric layers and internal electrode layers. The external contact can serve for electrically contacting the internal electrode layers. The main body is embodied in an ashlar form, for example.

Preferably, the dielectric layers and the internal electrode layers are stacked along a stacking direction. The stacking direction preferably corresponds to the longitudinal direction of the main body. Preferably, the dielectric layers and the internal electrode layers are stacked alternately one above another.

Preferably, the internal electrode layers contain copper or consist of copper. Alternatively, the internal electrode layers contain silver-palladium or consist of silver-palladium. Alternatively, the internal electrode layers contain some other electrically conductive material.

The dielectric layers can comprise a piezoelectric material. By way of example, the dielectric layers can comprise a ceramic material, in particular a piezo ceramic material. Green sheets can be used for producing the main body, to which green sheets for example a metal paste is applied for forming internal electrode layers. By way of example, the metal paste is applied in a screen printing method. The metal paste can contain copper. Alternatively, the metal paste can contain silver or silver-palladium. After the metal paste has been applied, the sheets are preferably stacked, pressed and jointly sintered, with the result that a monolithic sintering body arises. Preferably, the main body of the component is formed by a monolithic sintering body, for example by a sintering body produced in the manner described above.

By way of example, the multi-layer component is embodied as a piezoelectric component, for example as a piezo-actuator. In the case of a piezo-actuator, when a voltage is applied to the internal electrode layers, piezo-electric layers arranged between the internal electrode layers expand, such that a stroke of the piezo-actuator is generated. The multi-layer component can also be embodied as some other component, for example as a multi-layer capacitor.

By way of example, the electrode paste is applied in such a way that the electrode layers, as viewed in the stacking direction, alternately extend as far as one outer side of the stack and are spaced apart from the opposite outer side of the stack. In this way, the electrode layers can alternately be electrically connected to one of the external electrodes.

Alternatively, the multi-layer component can be a fully active multi-layer component. In the case of a fully active multi-layer component, the internal electrode layers extend over the entire cross section of the main body. For alternately connecting the internal electrode layers to the external contact, the internal electrode layers are alternately covered with electrically insulating material on an outer side. Preferably, the internal electrode layers, in the stacking direction, are alternately electrically connected to one of the external electrodes and electrically insulated from the other external electrode.

The external contact preferably serves for applying a voltage between internal electrode layers that are adjacent in the stacking direction. In particular, the external contact serves for feeding electric current to the internal electrode layers. In particular, the external contact serves to distribute electric current in the multi-layer component. The external contact is preferably arranged directly on the main body. In particular, the external contact is connected to the main body over the whole area.

The external contact comprises two external electrodes, for example. The external electrodes are preferably arranged on opposite outer sides of the main body. Preferably, the internal electrode layers, in the stacking direction, are alternately electrically connected to one of the external electrodes and electrically insulated from the other external electrode. In this case, the external contact can be designed with regard to the loads at the main body.

The external contact is embodied in a strip-shape fashion, for example. Preferably, the external contact runs along the stacking direction of the main body. By way of example, the external contact covers an outer side of the main body only partly. Alternatively, the external contact can cover an outer side of the main body completely.

The external contact can be embodied for example as a metal sheet, as a screen or in a meandering fashion. In this case, the external contact can be soldered to the main body.

By way of example, the external contact is connected to the main body via an external metalization, a sputtering layer, solder or conductive adhesive on a side surface of said main body. In particular, the external contact is directly connected to the internal electrode layers. Alternatively, the external contact can be applied as a layer to a side surface of the main body by means of screen printing methods.

The further contact can be embodied for example as a pin or as a sheet-metal strip. The further contact can be connected to an external current source. In particular, the further contact serves for feeding electric current or electrical voltage to the external contact.

The connecting element is preferably an element having a low stiffness. Preferably, the connecting element has a high flexibility. A decoupling of mechanical loads between the further contact and the external contact and thus the main body is obtained as a result.

The connecting element can be embodied for example as a meandering wire element, as a screen element or as a metal sheet.

The use of a connecting element between the further contact and the external contact enables a space-saving external contact design. In particular, the external contact need not be led around a corner of the main body.

Furthermore, the pitch of the connection location with respect to the further contact is freely selectable within large limits. In particular, the distances between the individual elements, e.g. pins, of the further contact can be varied.

Moreover, the further contact can be arranged freely. It is thereby possible to create space for the positioning of additional elements at the further contact. Such additional elements can be arranged in particular within a potting. By way of example, an insulation layer can be present at the further contact. Such an insulation layer has an advantageous effect with regard to the creepage current strength.

In accordance with one embodiment, the connecting element is embodied as a separate element with respect to the external contact.

In accordance with a further embodiment, the connecting element is embodied as an integral element of the external contact. In particular, the connecting element can comprise an extension of the external contact. By way of example, the external contact can have an extension that is not fixedly connected to the main body. Said extension can be bent over in such a way that it runs above the external contact in a plan view of the side surface of the main body. The extension preferably runs parallel or approximately parallel to the external contact. In accordance with one embodiment, the extension runs at an acute angle with respect to the external contact. The extension can be bent over along an edge that runs perpendicular to the stacking direction of the main body.

In accordance with one embodiment, the external contact, the connecting element and the further contact are in each case embodied as separate elements with respect to one another. In accordance with a further embodiment, the external contact, the connecting element and the further contact can be embodied integrally.

In accordance with one embodiment, the connecting element runs in a plane along a side surface of the main body. The plane runs parallel or approximately parallel to the main body, for example. In a further embodiment, the plane can run at an acute angle with respect to the side surface. In particular, the connecting element is embodied in a planar fashion. That is to say that the connecting element is free of curvatures. Small curvatures which occur locally in the region of the fixing of the connecting element to the external contact or the further contact can be disregarded here.

The edges of the connecting element which run parallel to the stacking direction are preferably free-standing, i.e. they are not fixedly connected to the main body. As a result, the connecting element is movable in a direction perpendicular to the stacking direction. This has an advantageous effect on the decoupling of mechanical stresses between the further contact and the external contact.

The fixing of the connecting element to the external contact is preferably effected along an edge of the connecting element which runs perpendicular to the stacking direction of the main body. Alternatively, the connecting element can be connected to the external contact only via an individual contact point. By way of example, the connecting element can be soldered to the external contact. Alternatively, the connecting element can be connected to the external contact by means of a conductive adhesive. Alternatively, the connecting element can be welded to the external contact. The connection of the connecting element to the further contact can likewise be effected by means of soldering, welding or by means of conductive adhesive.

In accordance with one embodiment, the connecting element is spaced apart from the main body continuously between the external contact and the further contact. That is to say that the connecting element, between its ends connected to the external contact and the further contact, has no further points of contact with the external contact.

In accordance with one embodiment, the further contact is arranged in such a way that it overlaps the main body in a longitudinal direction. The overlap has an advantageous effect on the creepage current strength. By way of example, the further contact overlaps approximately one third of the main body. However, the further contact can also overlap more or less than one third of the main body.

The further contact can be arranged in a manner spaced apart from the main body.

The multi-layer component is explained below with reference to schematic figures that are not true to scale.

Figure 2:
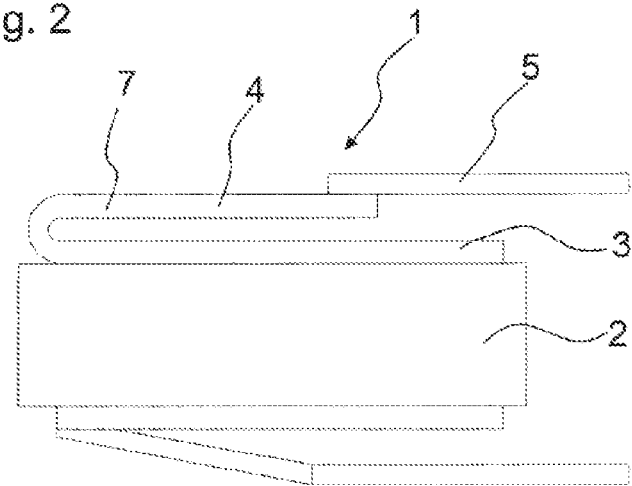

In the figures:

FIG. 1 shows a multi-layer component comprising an external contact, a further contact and a connecting element in a side view, FIG. 2 shows a multi-layer component with two different embodiments of the connecting element in a side view, FIG. 3 shows a multi-layer component with a further embodiment of the connecting element and the further contact in a side view, FIG. 4 shows a multi-layer component with a further embodiment of the connecting element and the further contact in a side view.

Figure 5:
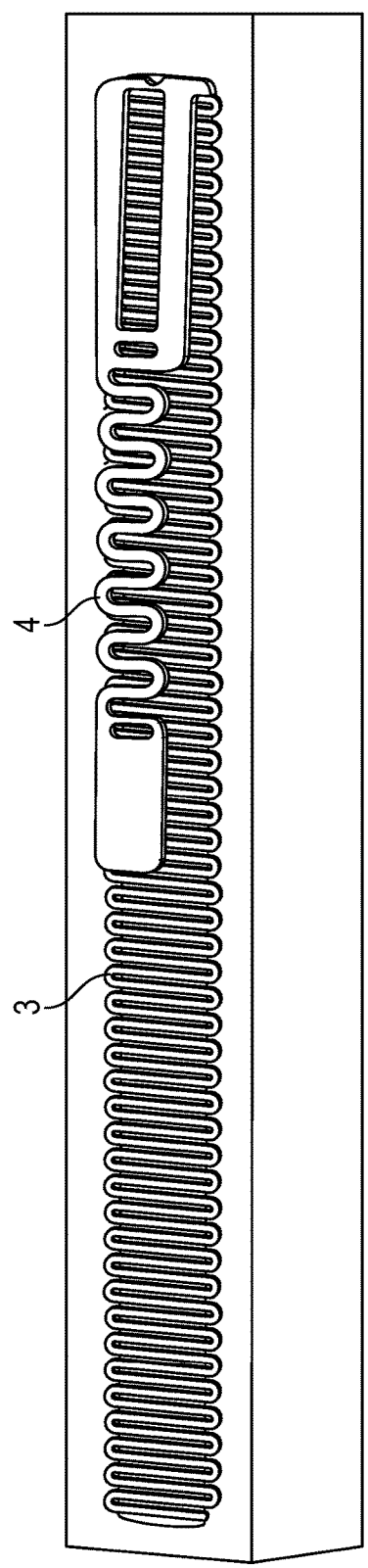

FIG. 5 shows an example of an external contact and/or a connecting element being embodied in a meandering fashion.

FIG. 1 shows a multi-layer component 1. The multi-layer component 1 comprises a main body 2 comprising a stack of alternately arranged internal electrode layers and piezoelectric layers (not shown). An external contact 3 is arranged on two opposite sides of the main body. The external contact 3 can comprise for example a screen mesh, a meandering element or a metal sheet. The external contact 3 is designed for contacting the internal electrode layers.

Two connecting elements 4 are arranged at the external contact 3. The connecting elements 4 can comprise a screen mesh, a flexible metal sheet or a meandering element. The connecting elements 4 connect the external contact 3 to a further contact 5. The connecting elements 4 are connected at their outer edges, or their extreme points, in each case to the external contact 3 and to the further contact 5. The connection of the connecting element 4 to the external contact 3 can consist in an individual point, e.g. a soldering point, or in an individual connecting line running perpendicular to the stacking direction S. Such a soldering point or such a connecting line is indicated by the point 6 in FIG. 1. Apart from that, the connecting element 4 is arranged in a manner spaced apart from the side surface of the main body 2, or from the external contact 3. In this case, the connecting element 4 forms an acute angle with the side surface of the main body.

The further contacts 5 are arranged in a manner spaced apart from the main body 2. In addition, the further contacts 5 are arranged perpendicularly to the stacking direction S. In a further embodiment, the further contacts 5 can also be inclined with respect to the stacking direction S.

The further contacts 5 are arranged in a manner overlapping the main body 2 in a longitudinal direction. This has an advantageous effect on the creepage current strength. In particular, the further contacts 5 overlap approximately one third of the main body 2.

The connecting elements 4 have a high flexibility. A decoupling of mechanical stresses between the further contacts 5 and the external contact 3 can take place in this way. Relief of the loading on the external contact 3 in relation to loads from the further contact 5 can take place as a result. In particular, vibrations that possibly occur are not transmitted from the further contacts 5 to the external contact 3 or to the main body 2, and vice versa. Damage to the multi-layer component 1 can be avoided as a result.

FIG. 2 shows a multi-layer component 1 with two further embodiments of a connecting element 4. Usually, however, two connecting elements 4 of identical type are arranged at a multi-layer component 1.

The embodiment arranged at the bottom in FIG. 2 is similar to the embodiment shown in FIG. 1, apart from the fact that the connecting element 4 is connected to the external contact 3 at the end thereof, in particular at an end of the external contact 3 that faces away from the further contact 5. In FIG. 1, by contrast, the connecting element 4 is connected to the external contact 3 in a central region thereof.

In the case of the embodiment arranged at the top in FIG. 2, the connecting element 4 is embodied as an integral part of the external contact 3. In particular, the external contact 3 has an extension 7 serving as connecting element 4. The extension 7 is not directly connected to the main body 2. As a result, it is possible to bend over the extension 7, as illustrated in FIG. 2, such that it runs parallel to the external contact 3, or to the side surface of the main body 2.

The further contact 5 is connected to the free end of the extension 7. The free end denotes that end of the extension 7 which is not directly connected to the main body.

The embodiment in which the connecting element 4 is embodied as an integral part of the external contact 3, in particular as an extension 7 of the external contact 3, affords the advantage that the connecting element 4 need not be fixed to the external contact. The method for producing the multi-layer component 1 can be simplified as a result.

FIG. 3 shows a further embodiment of a multi-layer component 1. FIG. 3 shows an external contact 3 having an extension 7, which runs parallel to the external contact 3 in a manner similar to that shown in FIG. 2. In contrast to the embodiment shown in FIG. 2, the extension 7 extends beyond the main body 2. In this way, the extension 7 of the external contact serves simultaneously as connecting element 4 and as further contact 5. The method for producing the multi-layer component 1 can be simplified further as a result. Moreover, in this embodiment, the further contact 5 also has a high flexibility. The decoupling of mechanical stresses between the further contacts 5 and the external contacts 3 is additionally improved as a result.

FIG. 4 shows two different possibilities for fitting the further contacts 5 to an extension 7 of the external contact 3, which extension can serve as connecting element 4, as described above.

The solution shown at the top in FIG. 4 has already been described in FIG. 2. It will be illustrated here again for the sake of better comparison. Hereinafter, the embodiment shown at the top is designated as embodiment 4.1. In embodiment 4.1, the connecting element 4 is fixed to the free end 8 of the multi-layer component 1. In this case, the connecting element 4 extends approximately over the length of the external contact 3 in the stacking direction S. The free end 8 of the multi-layer component 1 is the end which is deflectable when a voltage is applied between the internal electrode layers. The fixed end 9 of the multi-layer component 1 is the end at which the main body 2 is fixedly mounted. In particular, a stop of the multi-layer component 1 is seated at the fixed end 9. The fixed end 9 is that end of the multi-layer component 1 which is directed toward the further contact 5.

In the embodiment shown at the bottom, designated hereinafter as embodiment 4.2, the connecting element 4 is fixed to the fixed end 9 of the multi-layer component 1. In this embodiment, the connecting element 4 extends only over a partial region of the external contact 3. In particular, the connecting element extends over approximately ⅓ of the external contact 3. In a further embodiment, the connecting element 4 can also extend over half or over ¾ of the external contact.

Embodiment 4.2 with the shorter connecting element 4 is advantageous with regard to the use of material. In particular, on account of the shorter length of the connecting element 4, the material costs are lower than in the case of the embodiment shown at the top in FIG. 4.

Embodiment 4.1, in which the connecting element 4 extends over the entire length of the external contact 3, is advantageous with regard to the flexibility of the connecting element. In particular, the further contact 5 in the case of the embodiment shown at the top is arranged outside the region of the bending radius of the extension 7, or of the connecting element 4. As a result, the free end 8 of the connecting element 4 can be brought close to the main body 2. Consequently, the further contact 5 can also be arranged close to the main body 2. In particular, the distance between a free-standing end 10 of the connecting element 4 and the main body 2 can be smaller than the bending diameter. A particularly space-saving arrangement can be achieved as a result.

A further difference is that the free-standing end 10 of the connecting element 4 is directed toward the further contact 5 in the case of embodiment 4.1, while the free-standing end 10 of the connecting element 4 is directed away from the further contact 5 in the case of embodiment 4.2 shown at the bottom.

This has the result that, in the case of embodiment 4.1, the connecting element 4 and the further contact 5 overlap only in a small region relative to the total length of the connecting element 4. As a result, a large part of the connecting element 4 remains uninfluenced by the further contact 5.

In the case of embodiment 4.2, by contrast, the further contact 5 and the connecting element 4 overlap almost completely.

LIST OF REFERENCE SIGNS

1 Multi-layer component
2 Main body
3 External contact
4 Connecting element
5 Further contact
6 Point
7 Extension
8 Free end of the multi-layer component
9 Fixed end of the multi-layer component
10 Free-standing end of the connecting element

The invention claimed is:

1. A multi-layer component, comprising:
   a main body with an external contact arranged thereon;
   a further contact for electrically contacting the multi-layer component; and
   a connecting element for connecting the external contact and the further contact,
   wherein the connecting element is embodied in such a way that a decoupling of mechanical stresses that occur in the further contact from the external contact is brought about,
   wherein the connecting element is an integral part of the external contact,
   wherein the connecting element is embodied as a meandering wire element, and
   wherein the external contact is embodied in a meandering fashion.

2. The multi-layer component according to claim 1, wherein the connecting element has a low stiffness.

3. The multi-layer component according to claim 1, wherein the connecting element runs in a plane along a side surface of the main body.

4. The multi-layer component according to claim 1, wherein the connecting element is spaced apart from the side surface of the main body continuously in a region between the external contact and the further contact.

5. The multi-layer component according to claim 1, wherein the connecting element is embodied integrally.

6. The multi-layer component according to claim 1, wherein the connecting element comprises an extension of the external contact, and
   wherein the extension is bent over in such a way that it runs approximately parallel or at an acute angle with respect to the main body.

7. The multi-layer component according to claim 1, wherein the connecting element is fixed to the external contact along an edge running perpendicular to the stacking direction.

8. The multi-layer component according to claim 1, wherein the connecting element is connected to the external contact via an individual contact point.

9. The multi-layer component according to claim 1, wherein the further contact overlaps the main body in a longitudinal direction.

* * * * *